(12) United States Patent
Tardy

(10) Patent No.: US 10,747,917 B1
(45) Date of Patent: Aug. 18, 2020

(54) METHOD FOR GENERATING A SIMULATION MODEL TO EVALUATE AIRCRAFT FLIGHT SYSTEMS

(71) Applicant: Bell Helicopter Textron Inc., Fort Worth, TX (US)

(72) Inventor: Jason M. Tardy, Dallas, TX (US)

(73) Assignee: Bell Helicopter Textron Inc., Fort Worth, TX (US)

( * ) Notice: Subject to any disclaimer, the term of this patent is extended or adjusted under 35 U.S.C. 154(b) by 854 days.

(21) Appl. No.: 15/345,816

(22) Filed: Nov. 8, 2016

(51) Int. Cl.
*G06F 30/20* (2020.01)
*G07C 5/08* (2006.01)(52) U.S. Cl.
CPC ........... *G06F 30/20* (2020.01); *G07C 5/0816* (2013.01)

(58) Field of Classification Search
CPC .......................... G06F 17/5009; G07C 5/0816
USPC ............................................................. 703/8
See application file for complete search history.

(56) References Cited

U.S. PATENT DOCUMENTS

| | | |
|---|---|---|
| 8,204,711 B2 | 6/2012 | Colmenares |
| 8,639,476 B2 | 1/2014 | Martell et al. |
| 9,021,409 B2 | 4/2015 | Vasudevan et al. |
| 9,097,755 B2 | 8/2015 | Dmitriev-Zdorov |
| 9,098,650 B2 * | 8/2015 | Baudisch ............ G06F 17/5009 |
| 9,165,471 B1 | 10/2015 | Chen et al. |
| 9,318,105 B1 | 4/2016 | Khosla |
| 9,340,278 B2 | 5/2016 | Hagerott et al. |
| 9,391,794 B2 | 7/2016 | Dmitriev-Zdorov |
| 9,399,511 B2 | 7/2016 | Kim et al. |
| 9,405,655 B2 | 8/2016 | Ziegler et al. |
| 9,464,958 B2 | 10/2016 | Shue |
| 2004/0004612 A1* | 1/2004 | Guest .................. G06F 17/5009 345/419 |
| 2005/0090978 A1* | 4/2005 | Bathory ............... G08G 5/0013 701/469 |
| 2010/0318336 A1* | 12/2010 | Falangas ................. G06F 30/15 703/8 |
| 2011/0264419 A1 | 10/2011 | Wegman |
| 2014/0207429 A1* | 7/2014 | Spira ................... G06F 17/5009 703/2 |
| 2015/0203215 A1* | 7/2015 | Falangas ................. G06F 30/15 703/2 |

(Continued)

FOREIGN PATENT DOCUMENTS

KR 20140114173 9/2014

*Primary Examiner* — Andre Pierre Louis
(74) *Attorney, Agent, or Firm* — Timmer Law Group, PLLC

(57) ABSTRACT

A method for generating a simulation model to evaluate a flight control system including determining at least one high level requirement for an aircraft flight system during a non-automated engineering process; generating at least one specification of the high level requirement; generating a model computer-readable program code based on the at least one specification; executing the model computer-readable program code to generate a model code unit; executing the model code unit to generate a procedure document; executing the model code unit to perform a simulation method to generate a bench test computer-readable program code: executing the bench test computer-readable program code on a bench test computing device to generate a simulation output; and comparing the simulation output to the at least one specification of the high level requirement to generate a pass or fail result.

14 Claims, 7 Drawing Sheets

(56) References Cited

U.S. PATENT DOCUMENTS

| | | | |
|---|---|---|---|
| 2015/0274282 A1* | 10/2015 | Kim | B64D 43/00 |
| | | | 701/3 |
| 2015/0274315 A1 | 10/2015 | Conrad | |
| 2016/0232084 A1 | 8/2016 | Bhat et al. | |
| 2016/0238481 A1* | 8/2016 | Brandon | G06F 30/15 |
| 2016/0300003 A1 | 10/2016 | Knoll et al. | |

* cited by examiner

| | |
|---|---|
| ID: | Unique identifier used in the header of both the bench script and procedure document |
| version: | Autogeneration framework configuration management information |
| signals: | Subclass with signal information |
| local: | Subclass with bench script local variable declarations |
| steps: | Subclass with detailed step instructions |
| FCSinit: | Boolean which may command a bench re-initialization prior to executing the test | signals (subclass):

| | |
|---|---|
| extname | External signal names |
| intname | Internal signal names |
| desc | Signal description |
| init | Initial value |
| type | Signal type |
| archive | Boolean to specify whether signal is to be recorded | local (subclass):

| | |
|---|---|
| name | Signal name |
| type | Signal type | steps (subclass):

| | |
|---|---|
| number | Step number |
| tag | Test case document section identifier |
| comment | Bench command comments |
| command | Bench commands |
| exectime | Predicted execution time |
| timecorr | Empirical time correction |
| description | Post-processing description |
| stepvars | Post-processing variables |
| clawvars | Virtual simulation variables |
| operator | Post-processing operation type |
| vals | Post-processing expected results |
| valtimes | Post-processing expected result times |
| v_tols | Post-processing vertical tolerances |
| h_tols | Post-processing horizontal tolerances |
| inthebox | Post-processing pass/fail threshold (number or % of points) |
| duration | Post-processing transition durations |

FIG. 2B

| | |
|---|---|
| AddArchive | Add signal or alias to cs. |
| AddLocal | Add local signal to cs. |
| AddSignal | Add unique signals and signal initializations to cs. If the signal is an alias |
| AddStepInfo | Add information to Step object (descriptions, STEP commands) |
| AddTag | Add Tag to step object |
| AddtoSteps | Add command/comment to Steps |
| ArchiveFilter | Filter internal signal list by processor |
| ArchivePause | Pause archive recording |
| ArchiveResume | Resume archive recording |
| BenchReset | Create bench reset block |
| Comment | Add comment to step |
| Console | Write console message |
| CreateInit | Create Initializations block |
| CreateProcedure | Create Word procedure document from cs |
| CreateScript | Create C# script from cs |
| FCSReset | Toggle FCS monitor reset |
| GetExpectedResults | Run harness on cs object to obtain expected results |
| Import | existing code from an external source |
| Message | Add message box to step |
| ModifyIC | Modify bench initial conditions in alias library |
| RampValue | Add command and associated comment ramping values of Bench components of signal or alias. An optional |
| SetSource | Add command and associated comment setting sources of signal or alias. An optional comment may also be |
| SetValue | Add command and associated comment setting values of Bench components of signal or alias. An optional |
| SineValue | Add command and associated comment generating sine waves of values of Bench components of signal or alias. |
| StepValue | Add command and associated comment stepping values of Bench components of signal or alias. An optional |
| StimWait | Wait for last Stim function to end |
| Substitute | Use substitution CTS to FCC modify memory address(es) |
| Wait | Add wait to step |

FIG. 2C

METHOD FOR GENERATING A SIMULATION MODEL TO EVALUATE AIRCRAFT FLIGHT SYSTEMS

BACKGROUND

Technical Field

The present disclosure relates to a method, a computer readable medium, and, a computer program product for generating a simulation model to evaluate aircraft flight systems.

Description of Related Art

Development of complex integrated control systems in an aircraft, such as fly-by-wire flight control systems, requires extensive modeling and evaluation of both hardware and software. A simulation model can analyze flight control systems in a laboratory environment which are complex and too time consuming for an exact theoretical or mathematical analysis. A simulation model performs multiple experiments on the aircraft flight control system to ultimately identify any errors therein prior to any actual flight of the aircraft. The simulation model can be huge, complicated, and complex. Therefore, the simulation model is executed by computer programs and computers.

There is a need for an improved simulation model for evaluating aircraft flight systems.

SUMMARY

In a first aspect, there is a method for generating a simulation model to evaluate a flight control system including determining at least one high level requirement for an aircraft flight system during a non-automated engineering process; generating at least one specification of the high level requirement; generating a model computer-readable program code based on the at least one specification; executing the model computer-readable program code to generate a model code unit; executing the model code unit to generate a procedure document; executing the model code unit to perform a simulation method to generate a bench test computer-readable program code; executing the bench test computer-readable program code on a bench test computing device to generate a simulation output; and comparing the simulation output to the at least one specification of the high level requirement to generate a pass or fail result.

In an embodiment, the high level requirement is a flight control law.

In another embodiment, the at least one specification comprises a verification statement.

In one embodiment, the procedure document is based partly on the at least one high level requirement and specification.

In yet another embodiment, the step of executing the model code unit is further configured for analyzing whether signal time histories comply with the at least one specification of the high level requirement.

In an embodiment, there is provided a step of constructing an alias database including at least one alias name and corresponding alias information. The step of executing the model computer-readable program code further includes receiving an alias name, extracting the corresponding alias information from the alias database, and inserting the corresponding alias information into the model code unit, the bench test computer-readable program code, and the procedure document.

In an embodiment, the corresponding alias information is selected from the group consisting of: a signal type, signal information, an alias description, a signal unit, a signal initial value, a signal description, and an alias source filename.

In still another embodiment, the simulated output is bench test data.

In another embodiment, there is a second simulation method including generating a simulated input time history for an aircraft fly-by-wire simulation using the model code unit, receiving the simulated input time history into the aircraft fly-by-wire simulation on a computing device, generating simulated output time histories from the aircraft fly-by-wire simulation; and extracting simulated results from the simulated output time histories.

In a second aspect, there is provided a computer readable program product including: a non-transitory computer-readable storage medium having computer-readable program code embodied therewith. The computer-readable program code includes a model computer-readable program code configured to receive at least one specification for a high level requirement for an aircraft flight system; and a model computer-readable program code configured to receive an alias name and extract corresponding alias information.

An embodiment provides that the corresponding alias information is selected from the group consisting of: a signal type, signal information, an alias description, a signal unit, a signal initial value, a signal description, and an alias source filename.

In another embodiment, the computer-readable program code further includes a model computer-readable program code configured to generate a model code unit. The model code unit is configured to generate a procedure document based on at least the one high level requirement.

In an embodiment, the model code unit is configured to automatically generate a bench test computer-readable program code.

In one embodiment, the model code unit is configured to generate a simulated input time history when at least one input command is provided to an aircraft fly-by-wire simulation and to receive expected results extracted from simulation output time histories.

In a third aspect, there is provided a method for generating a simulation model to evaluate a prototype system including: determining at least one high level requirement for a prototype system during a non-automated engineering process; generating at least one specification of the high level requirement; generating a model computer-readable program code based on the at least one specification; executing the model computer-readable program code to generate a model code unit; executing the model code unit to generate a procedure document; executing the model code unit to perform a simulation method to generate a bench test computer-readable program, code; executing the bench test computer-readable program code on a bench test computing device to generate a simulation output; and comparing the simulation output to the at least one specification of the high level requirement to generate a pass or fail result.

In an embodiment, there is further provided the step of constructing an alias database including at least one alias name and a corresponding signal information. The step of executing the model computer-readable program code further includes receiving an alias name, extracting the corresponding alias information from the alias name, and inserting the corresponding alias information into the model code unit, the bench test computer-readable program code, and the procedure document.

In one embodiment, the corresponding alias information is selected from the group consisting of: a signal type, signal information, an alias description, a signal unit, a signal initial value, a signal description, and an alias source filename.

In still another embodiment, the procedure document is based partly on the at least one high level requirement.

In yet another embodiment, the simulated output is bench test data.

Other aspects, features, and advantages will become apparent from the following detailed description when taken in conjunction with the accompanying drawings, which are a part of this disclosure and which illustrate by way of example, principles of the inventions disclosed.

DESCRIPTION OF THE DRAWINGS

The novel features believed characteristic of the embodiments of the present disclosure are set forth in the appended claims. However, the embodiments themselves, as well as a preferred mode of use, and further objectives and advantages thereof, will best be understood by reference to the following detailed description when read in conjunction with the accompanying drawings, wherein:

FIG. 2B is an example of a model code unit test class structure, according to one example embodiment;

FIG. 2C is an example of major model code unit test class methods, according to one example embodiment;

DESCRIPTION OF THE PREFERRED EMBODIMENT

Figure 1A:
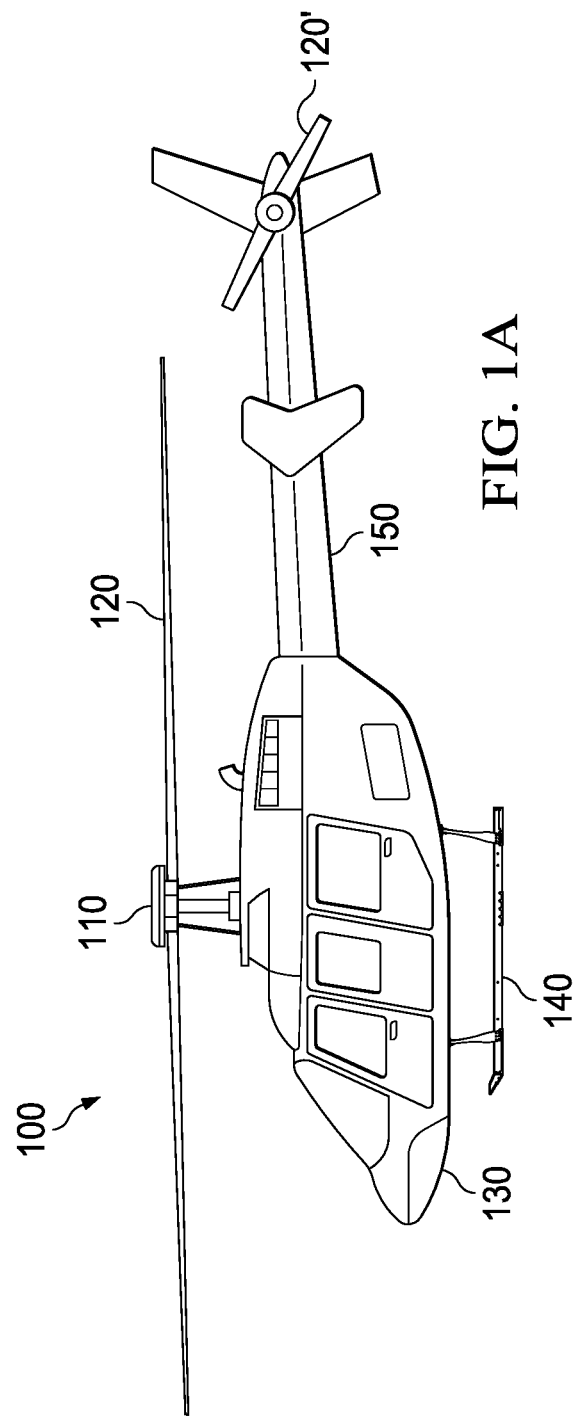
FIG. 1A shows a rotorcraft according to one example embodiment.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely in hardware, entirely in software (including firmware, resident software, micro-code, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RE, etc., or any suitable combination of the foregoing.

Computer program code for carrying out operations for aspects of the present disclosure may be written in any combination of one or more programming languages, including an object oriented programming language, such as JAVA®, SCALA®, SMALLTALK®, EIFFEL®, JADE®, EMERALD®, C++, C#, VB.NET, PYTHON® or the like, conventional procedural programming languages, such as the "C" programming language, VISUAL BASIC®, FORTRAN® 2003, Perl, COBOL 2002, PHP, ABAP®, dynamic programming languages such as PYTHON®, RUBY® and Groovy, or other programming languages. The program code may execute entirely on the user's computer, partly on the user's computer, as a stand-alone software package, partly on the user's computer and partly on a remote computer or entirely on the remote computer or server. In some embodiments, the remote computer can be a bench test computer. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatuses (systems) and computer program products according to aspects of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

FIG. 1A shows an aircraft 100 according to one example embodiment. The aircraft 100 features a rotor system 110, blades 120, a fuselage 130, a landing gear 140, and an empennage 150. The rotor system may rotate blades 120. Rotor system 110 may include a control system 110 for selectively controlling the pitch of each blade 120 in order to selectively control direction, thrust, and lift of an aircraft 100. Fuselage 130 represents the body of the aircraft 100 and may be coupled to rotor system 110 such that rotor system 110 and blades 120 may move fuselage 130 through the air. Landing gear 140 supports aircraft 100 when aircraft 100 is landing and/or when aircraft 100 is at rest on the ground. Empennage 150 represents the tail section of the aircraft and features components of the rotor system 110 and blades 120'. Blades 120' may counter the torque effect created by the rotor system 110 and blades 120. Teachings of certain embodiments relating to an aircraft described herein may apply to rotor system 110 and/or other systems, such as other rotorcraft, tilt rotor, and helicopter flight systems. It should also be appreciated that teachings from aircraft 100 may apply to aircraft other than a rotorcraft, such as airplanes and unmanned aircraft, to name a few examples.

Figure 1B:
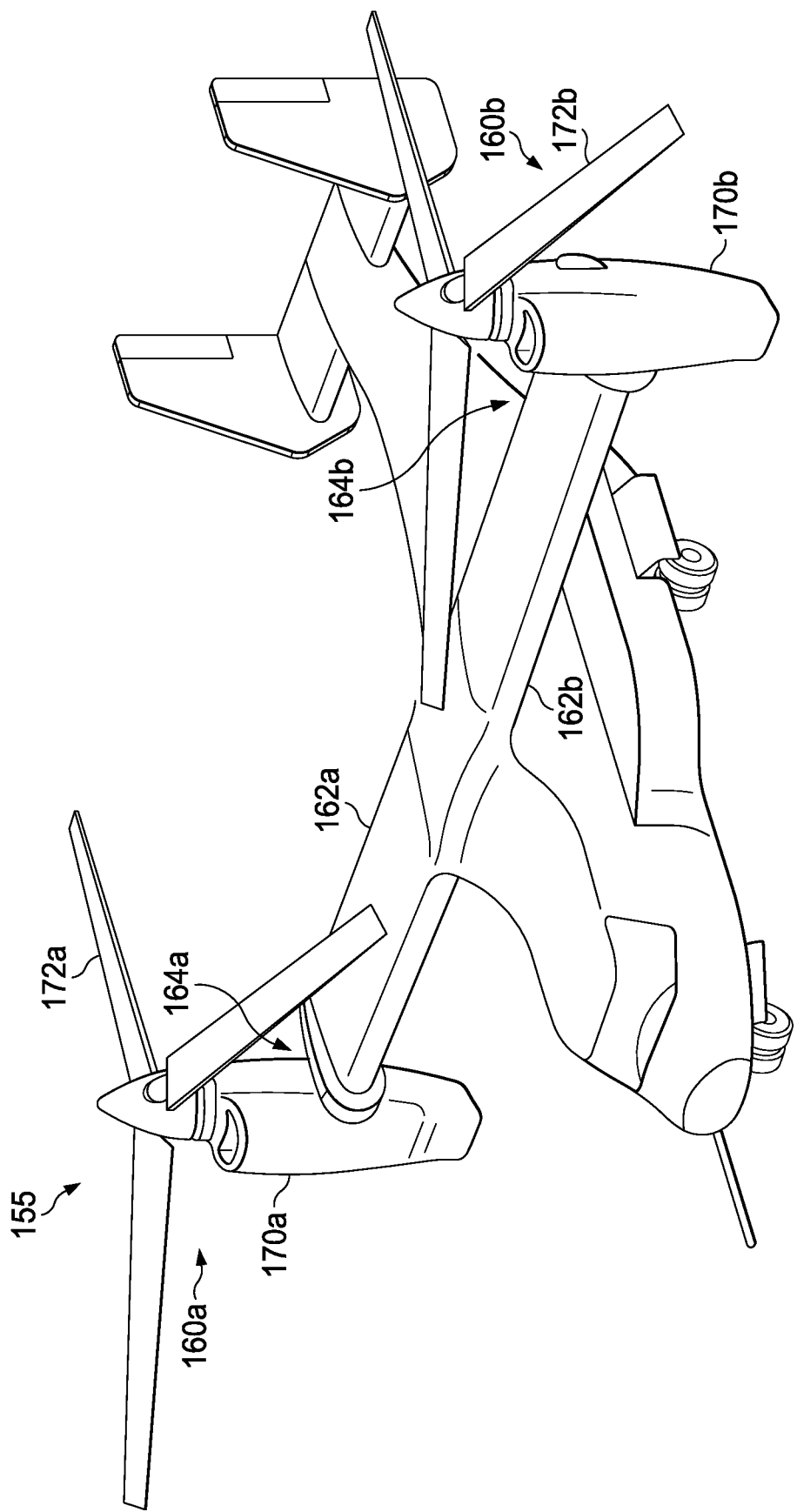
FIG. 1B shows a tiltrotor aircraft according to one example embodiment.

For example, FIG. 1B illustrates a tiltrotor aircraft 155 that utilizes the system in accordance with the present application. Tiltrotor aircraft 155 includes rotor assemblies 160a and 160b that are carried by wings 162a and 162b, and are disposed at end portions 164a and 164b of wings 162a and 162b, respectively. Tilt rotor assemblies 160a and 160b include nacelles 170a and 170b, which carry the engines and transmissions of tilt rotor aircraft 155, as well as, proprotors 172a and 172b on forward ends 174a and 174b of tilt rotor assemblies 160a and 160b, respectively. Tilt rotor assemblies 160a and 160b move or rotate relative to wing members 162a and 162b between a helicopter mode in which tilt rotor assemblies 160a and 160b are tilted upward, such that tilt rotor aircraft 155 flies like a conventional helicopter; and an airplane mode in which tilt rotor assemblies 160a and 160b are tilted forward, such that tilt rotor aircraft 155 flies like a conventional propeller driven aircraft.

A pilot may manipulate one or more flight controls in order to achieve controlled aerodynamic flight. Inputs provided by the pilot to the pilot flight controls may be transmitted mechanically and/or electronically (e.g., via a fly-by-wire flight control system) to flight control devices. Flight control devices may represent devices operable to change the flight characteristics of the aircraft. Flight control devices on aircraft 100 may include the aircraft flight control system operable to change the positions of blades 120 and blades 120'. Flight control devices on tiltrotor aircraft 155 may include aircraft flight control systems operable to change the positions of the nacelles 170a and 170b.

Figure 2A:
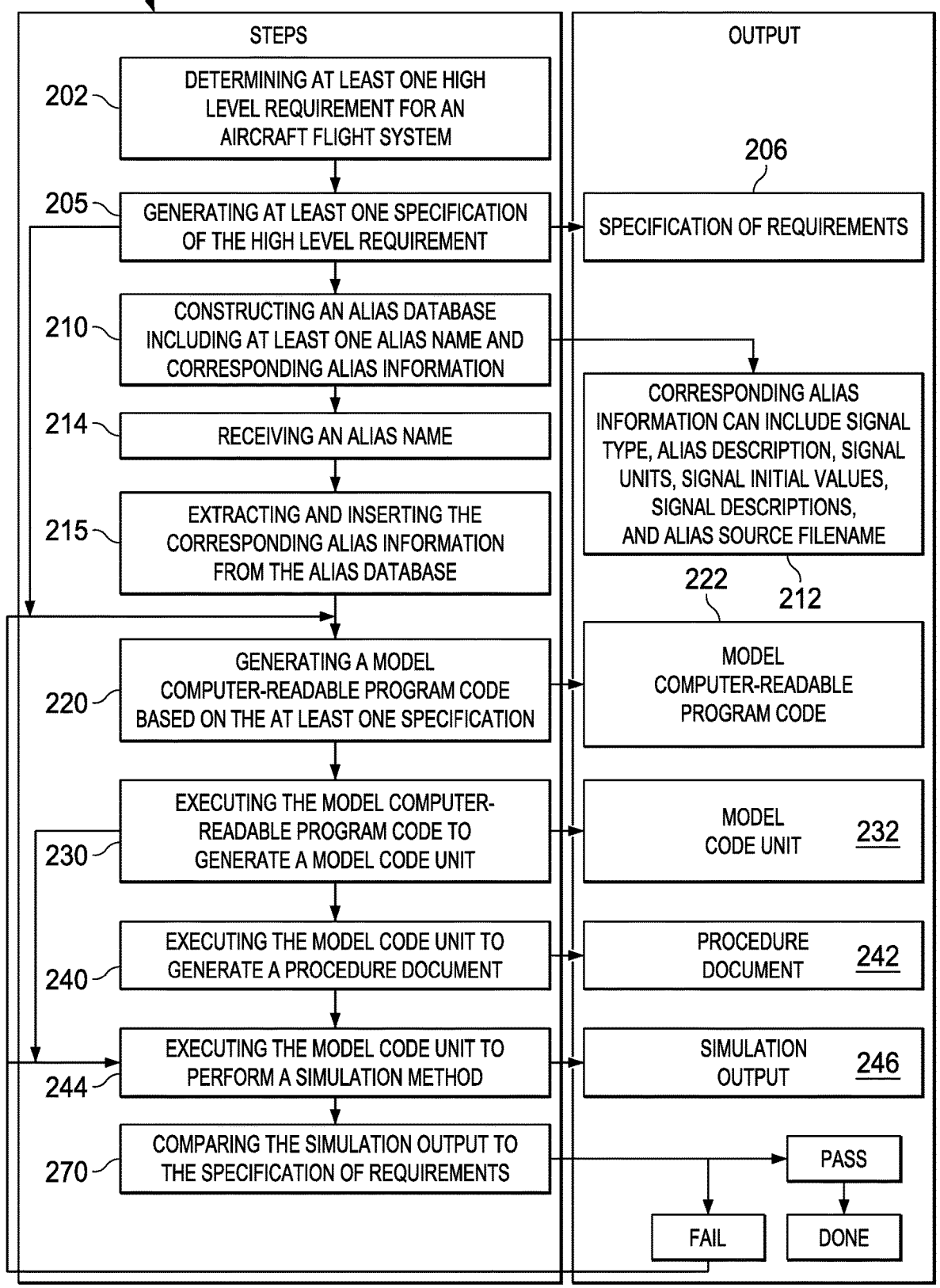
FIG. 2A shows an exemplary workflow for generating a simulation model, according to one example embodiment.

FIG. 2A shows an exemplary method 200 for generating a simulation model to evaluate a flight control system. The flight control system can be any aircraft or aircraft subsystem that requires laboratory bench testing prior to flight. The method 200 can include various steps and outputs as described herein. Each of the steps in method 200 can have an output as a model and/or data.

A first step includes determining at least one high level requirement 202 for an aircraft flight system during a non-automated engineering process. An example provides that the high level requirement is a flight control law. The control law can be any suitable logic based control law to achieve safe flight conditions.

A second step includes generating at least one specification of the high level requirements 205, which provides an output of a at least one specification of requirement 206. In an embodiment, there are two, three, or even more specification of requirements 206. The specification of the requirements 206 is important in that it correlates to physical effects that may be essential for developing a safe product or system which meets performance goals. Moreover, the specification of the requirements 206 identifies the level of detail, evaluation, and validation that is achieved in the later performed steps.

An example provides that the specification of requirements 206 is a verification statement. The specification of requirements 206 includes any simulation processes, validation tests, verification statements, or other methods needed to achieve the high level requirements in step 202.

In an exemplary embodiment, the high level requirement for the aircraft flight system is a control law true airspeed that shall be equal to sensed true airspeed when true airspeed is valid and to control law calibrated airspeed otherwise. The control law can include the following specification of requirements 206 for the simulation model: setting pylon angle to 45 degrees, setting calibrated airspeed to 100 knots, setting sensed true airspeed to 150 knots, setting true airspeed invalid as true and verify that control law true airspeed is equal to calibrated airspeed, and setting true airspeed invalid as false and verify that control law true airspeed is equal to sensed true airspeed.

A third step can include constructing an alias database 210 including at least one alias name and corresponding alias information. The alias database 212 includes user defined strings which are associated with specific lists of signals and other relevant information for the control laws and associated processes. In one embodiment, the alias database 212 includes at least one of the following corresponding alias information: a signal type, an alias description, a signal unit, a signal initial value, a signal description, and an alias source filename.

The data in the alias database 212 can be accessed in a fourth step by receiving an alias name 214 and in a fifth step extracting and inserting the corresponding alias information 215. The alias name 214 is provided to extract the corresponding alias information from the database 212. The extracted corresponding alias information can include inserting the corresponding signal information into at least one of the following: a model code unit 232, a simulation output 246, a bench test computer-readable program, and a procedure document 242.

A sixth step 220 can include generating a model computer-readable program code based on the at least one specification of requirements 206 to produce a model computer-readable program code 222. An embodiment provides that the generating the model computer-readable program code step 220 involves a software class that has been defined in a high level language, for example, but not limited to, Matlab. The software class specifies the inputs, which can be selected from a variety of fields, subclasses, and methods, as shown in FIGS. 2B and 2C. The user can select and create an object of a class and populate it with information related to the specification of requirements 206 using the model computer-readable program code 222.

In one embodiment, generating the model computer-readable program code 220 includes receiving an alias name 212, extracting, data from the alias database 215 and inserting the extracted alias data into the model computer-readable program code 222. In an embodiment, the model computer-readable program code 222 is generated manually and specifies processes, utilities, and functions for the method of the simulation model 200, including, but not limited to, constructing input time histories, time delays, hardware resets, bench information dialog boxes, and requirement specification parameters; the embodiment provides that signal information may be input directly, by referencing aliases in the alias database 212, or by a combination of the two.

In another example, the text of the specification of requirements 206 is received by a computing device, which has a computer-readable program code that can extract the text of the specification of requirements 206 and then automatically generate at least a portion of the model computer-readable program code 222 based on the extracted text of the specification of requirements 206.

In an exemplary embodiment of the generating the model computer-readable program code 220 step, at least one of the following functional instructions is included: initialize the model computer-readable program code 222 for the model code unit 232; loading the alias database 212; determining the output directories and filenames; set a number of signals to default values; set an archive list, including, but not limited to, adding aliases to the archive list to record the time histories of the signals in each alias; set local variables; set preset information including, but not limited to, various practical and empirical values, set miscellaneous parameters, specify signal values, specify signal values with variables, set diagnostic flags; set step verify commands including, but not limited to, checking for signals that equal some value, checking that signals are between two values; initialization; and set cleanup.

In one embodiment, the model computer-readable program code 222 can include instructions for computing functions in repeating loops.

In an embodiment, the model computer-readable program code 222 can include at least one of the following functional instructions for a simulation method 244: creating a lower level language computer-readable program code for validation testing and calculating expected results.

In one embodiment, the model computer-readable program code 222 can include functional instructions for generating a procedure document based partly on the at least one high level requirement and optionally on the specification of requirements 206.

Figure 4:
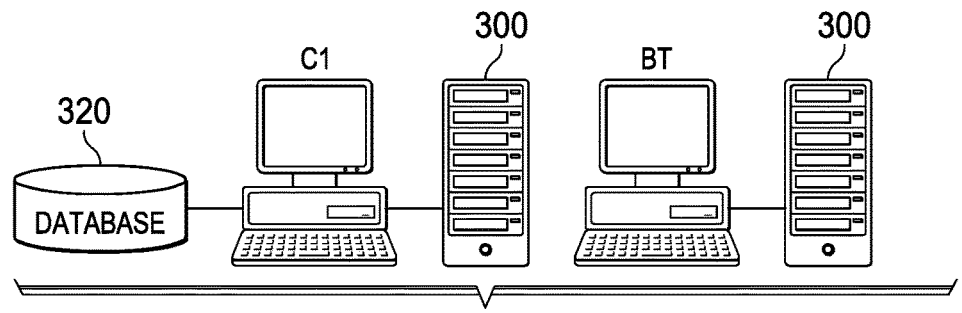
FIG. 4 is a high level block diagram of hardware that may be used to implement the simulation model 200, according to one example embodiment.

A seventh step 230 can include executing the model computer-readable program code 222 on a computing device C1, as shown in FIG. 4, to generate a model code unit 232. In one embodiment, the executing step 230 can include extracting data from the alias database to generate the model code unit 232. The model code unit 232 is an application that can function as a structural database or repository and can perform simulation methods 244.

In one embodiment, executing the model code unit 232 is an object oriented process that can store structured information and perform various methods (functions) on the structured information. In one embodiment, the model code unit 232 is configured for analyzing whether a signal time history comply with a requirement specification 206. An embodiment provides that the executing step 230 includes analyzing at least one input signal. The input signal can include at least one of the following: set value, which sets a signal to a specific value; ramp value, which ramps a signal up or down in a particular time frame; step value, which performs a step function on a signal; and a sine value, which generates a signal sine wave. The step of executing the model code unit 232 can further include creating the model code unit as an object oriented process.

An eighth step 240 includes executing the model code unit 232 on a computing device C1 to generate a procedure document 242. The procedure document 264 is based at least partly on the at least one high level requirement. In one embodiment, the procedure document is based at least partly on the specification of requirements 206. The procedure document 242 provides detailed instructions for demonstrating compliance with the specification of requirements 206 including generation of the simulated output via the model code unit and the assessment of the output against the high level requirements and specification of requirements 206. The procedure document 242 advantageously describes procedures, methods, and functions in the simulation model that can be reviewed, evaluated, and understood by users and safety engineers.

Figure 3:
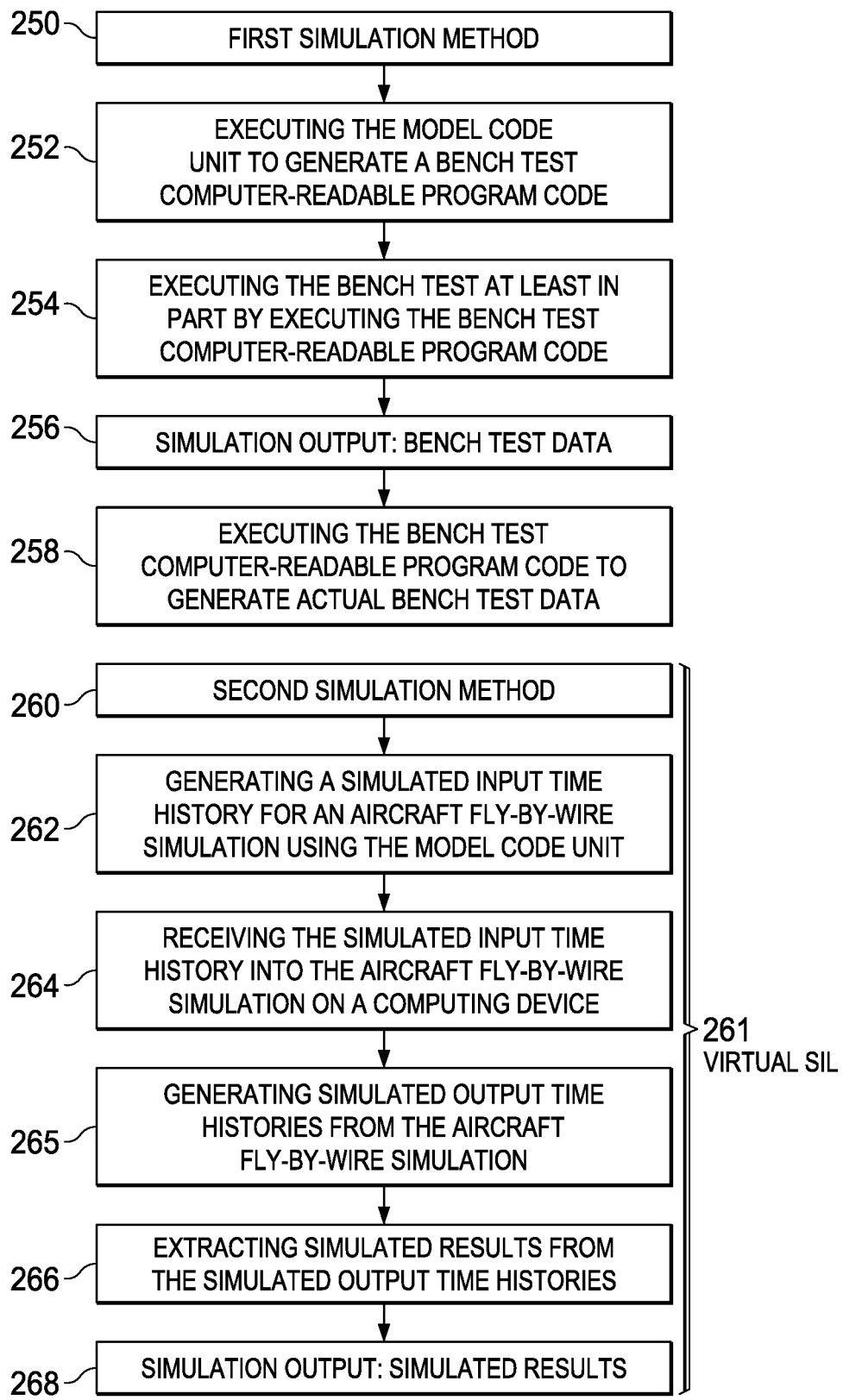
FIG. 3 shows exemplary workflows of the simulation method 244 as a first method 250 and a second method 260, according to one example embodiment.

In one embodiment, the ninth step 244 involves executing the model code unit 232 on a computing device C1 or BT to perform a simulation method that will, generate a simulation output 246. The simulation methods 244 step can be various methods that are performed to generate a simulation output 246. FIG. 3 is an exemplary embodiment of several post processing simulation methods including a first method 250 and a second method 260.

FIG. 3 shows exemplary schematic workflows for embodiments of the simulation method 244. It will be appreciated that the contemplated embodiments are configured for aircraft control systems. In a contemplated embodiment, a simulation method 244 can, involve making design corrections, evaluation of individual components or subsystems, rapid assessment of potential design improvements, rapid evaluation of real-world test anomalies, and other functions in prototype evaluation.

The first simulation method 250 includes executing the model code unit 232 to generate a bench test computer-readable program code 252. In one embodiment, the bench test computer-readable program code 252 can be a low level code; for example, but not limitation, any C variation as described herein. In one embodiment, the procedure document 242 and the bench test computer-readable program code are similar or otherwise match generally, because each is generated from the model code unit 232. This advantageously can provide reduced review and correction time since both documents are generated from the same source. In one embodiment, reviewing of only one of the procedure document 242 and the bench test computer-readable program code 252 is needed; either the procedure document 242 or the bench test computer-readable program code 252 is reviewed to identify any errors in both. Any errors can be corrected by revising model computer-readable program code at the step 220, which also corrects and regenerates at least one of following: the model code unit 232, procedure document 242, bench test computer-readable program code 252, and a simulation output 246.

The first simulation method 250 further includes executing the bench test at least in part by executing the bench test computer-readable program code on a bench test computing device 254 to generate bench test data 256 as the simulation output 246. The bench test computer BT, shown in FIG. 4, is not connected with computer C1 at any time during the first simulation method steps 252, 254, and 256.

The second simulation method 260 can simulate a laboratory environment in a virtual system integration lab 261. The second simulation method 260 includes generating a simulated input time history for an aircraft fly-by-wire simulation using the model code unit 262, receiving the simulated input time history into the aircraft fly-by-wire simulation on a computing device 264, generating simulated output time histories from the aircraft fly-by-wire simulation 265; and extracting simulated results from the simulated output time histories 268. The desktop computer C1 can be used to generate simulated input time histories using the model code unit 232. The simulated input time histories are then received into flight computer software such as the aircraft fly by wire simulation software, which generates simulated output time histories. Simulated results 268 are extracted from the simulated output time histories. Simulated results 268 is the simulation output 246 for the second simulation method 260.

The purpose of the second simulation method 260 is to run a simulation of the bench test model which in theory attempts to match the bench test model. The output of the simulated results 268 can advantageously be first reviewed and evaluated prior to using valuable bench test computer BT time and computing resources as needed in the first simulation method 250. If the simulated results 268 indicates that changes to the model are needed, the user can make changes to the model computer-readable program code 222 as desired until the model computer-readable program code 222 and hence the model code unit 232 is ready for bench testing as described in the first simulation method 250. The second method 260 can advantageously permit independent control law testers to use a desktop C1 model-based approach to assist iterative design of the methods in the simulation model 200. In an embodiment, the simulated expected results may be automatically input into the specification of requirements 206 section of the procedure document 242.

Ultimately the simulation output 246 is compared to the specification of requirements 206 to determine if the simulation output 246 passes or fails in the tenth step 270. The tenth step 270 is a validation step that generates a pass or fail output. If the validation step 270 fails, the model computer-readable program code 222 can be revised to achieve a workable simulation mode if possible. In an embodiment, if the model computer-readable program code 222 is revised, the model code unit 232, bench test computer-readable program code 252, and the procedure document 242 is also automatically revised.

Another outcome is that the prototype aircraft flight control system or other subsystem being evaluated may itself need to be altered to satisfy the design requirements necessary for actual flight. An aspect of the method for generating a simulation model to evaluate a flight control system is that it can determine where the prototype aircraft flight control system or simulation model fail so that the prototype or the simulation model can be adjusted prior to any actual flight involving pilots and crew.

In one embodiment, the tenth step 270 is performed by a data validation software.

Although shown associated with an aircraft, it will be appreciated that the systems and methods of the present application could also be utilized with different types of vehicles, machinery or electronic devices that use a laboratory bench test prior to operation by a user. One embodiment provides a method for generating a simulation model to evaluate a prototype system including: determining at least one high level requirement for a prototype system during a non-automated engineering process; generating at least one specification of the high level requirement; generating a model computer-readable program code based on the at least one specification; executing the model computer-readable program code to generate a model code unit; executing the model code unit to generate a procedure document; executing the model code unit to perform a simulation method to generate a bench test computer-readable program code; executing the bench test computer-readable program code on a bench test computing device to generate a simulation output; and comparing the simulation output to the at least one specification of the high level requirement to generate a pass or fail result.

Figure 5:
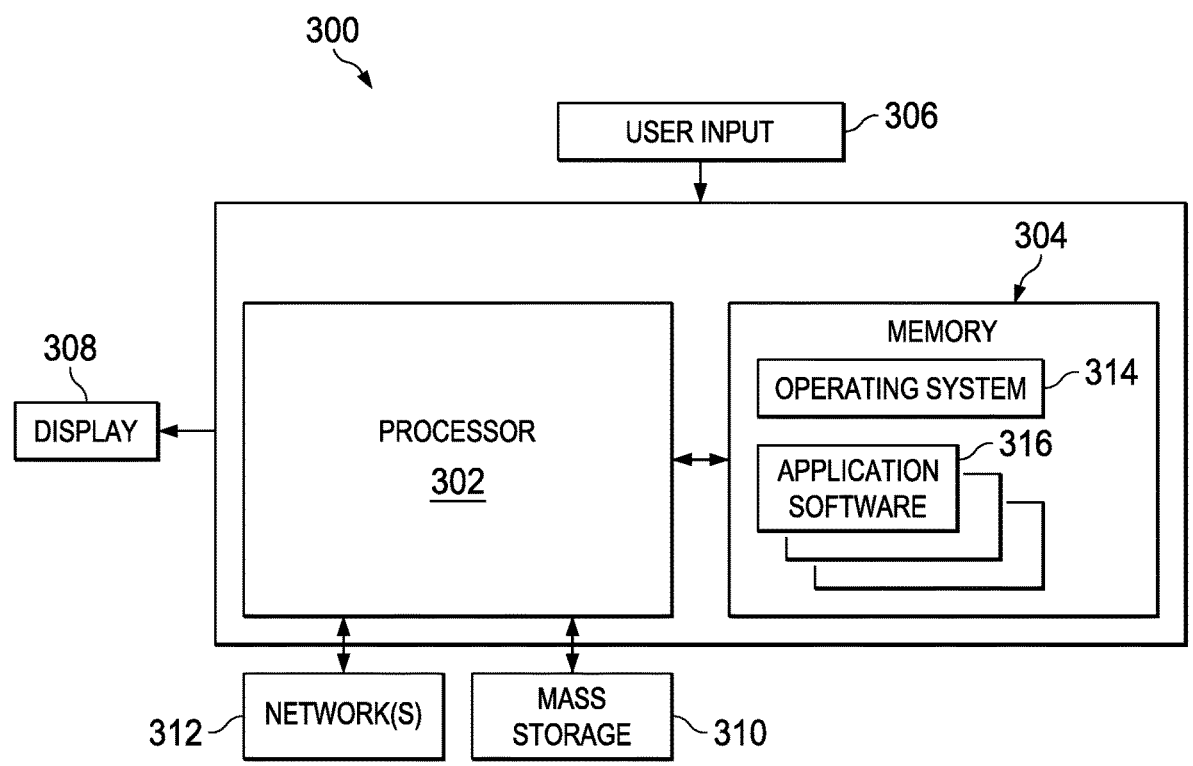
FIG. 5 is a schematic diagram illustrating the implementation of the workflow for generating the simulation model, according to one example embodiment.

FIGS. 4 and 5, are examples of hardware 300 that may be used to implement the embodiments described herein. The hardware 300 typically includes at least one processor 302 coupled to a memory 304. The processor 302 may represent one or more processors (e.g., microprocessors), and the memory 304 may represent random access memory (RAM) devices including a main storage of the hardware 300, as well as any supplemental levels of memory, e.g., cache memories, non-volatile or back-up memories (e.g., programmable or flash memories), read-only memories, etc. In addition, the memory 304 may be considered to include memory storage physically located elsewhere in the hardware 300, e.g., any cache memory in the processor 302, as well as any storage capacity used as a virtual memory, e.g., as stored on a mass storage device 310.

The hardware 300 also typically receives a number of inputs and outputs for communicating information. For example, the alias database 222 can be on located on a remote hardware device 320 as shown in FIG. 4. For interface with a user or operator, the hardware 300 may include one or more user input devices 306 (e.g., a keyboard, a mouse, etc.) and a display 308 (e.g., a cathode ray tube monitor, a liquid crystal display panel). An embodiment provides that local copies of the alias database 212 can reside on the desktop computer C1 used to generate all code and procedures and run the fly-by-wire simulation to automatically generate expected results. In another embodiment, the alias database 212 can reside on a remote computer and accessed by multiple users via a network.

For additional storage, the hardware 300 may include one or more mass storage devices 310, e.g., a floppy or other removable disk drive, a hard disk drive, a Digital Versatile Disk (DVD) drive, etc.) and/or a tape drive, among others. Furthermore, the hardware 300 may include an interface with one or more networks 312 (e.g., a local area network (LAN), a wide area network (WAN), a wireless network, and/or the Internet among others) to permit the communication of information with other computers coupled to the networks. It should be appreciated that the hardware 300 typically includes suitable analog and/or digital interfaces between the processor 302 and each of the components 304, 306, 308, and 312 as is well known in the art.

The hardware 300 operates under the control of an operating system 314, and executes various computer software applications 316, components, programs, objects, modules, etc. (e.g., a program or module which performs operations and functions as described above). Moreover, various applications, components, programs, objects, etc., may also execute on one or more processors in another computer coupled to the hardware 300 via a network 312, e.g., in a distributed computing environment, whereby processing required to implement the functions of a computer program may be allocated to multiple computers over a network.

The illustrative embodiments provide an improved simulation model for an aircraft system that have at least one of the following advantages: provides a method for identifying and correcting model errors quickly, iterations of the simulation model may be implemented rapidly with little to no error (i.e., minutes to hours instead of days or weeks), and simulation models can be generated and validated during development on the C1 computer rather than using valuable bench test computer time.

At least one embodiment is disclosed and variations, combinations, and/or modifications of the embodiment(s) and/or features of the embodiment(s) made by a person having ordinary skill in the art within the scope of the disclosure. Alternative embodiments that, result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes 2, 3, 4, etc.; greater than 0.10 includes 0.11, 0.12, 0.13, etc.). For example, whenever a numerical range with a lower limit, $R_l$, and an upper, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, 50 percent, 51 percent, 52 percent, . . . , 95 percent, 96 percent, 97 percent, 98 percent, 99 percent, or 100 percent. Unless otherwise stated, the term "about" shall mean plus or minus 5 percent of the subsequent value. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrow terms such as consisting of, consisting essentially of, and comprised substantially of. Accordingly, the scope of protection is not limited by the description set out above but is defined by the claims that follow, the scope including all equivalents of the subject matter of the claims. Each and every claim is incorporated as further disclosure into the specification and the claims are embodiment(s) of the present invention.

The invention claimed is:

1. A method for generating a simulation model to evaluate a flight control system prior to actual flight involving pilots and crew comprising:
determining at least one high level requirement for a flight control law for an aircraft flight system during a non-automated engineering process;
generating at least one specification of the high level requirement;
generating a model computer-readable program code based on the at least one specification;
executing the model computer-readable program code to generate a model code unit for the flight control law of the aircraft flight system;
executing the model code unit to generate a procedure document;
executing the model code unit to perform a simulation method to generate a bench test computer-readable program code, the bench test computer-readable program code is similar to the procedure document;
executing the bench test computer-readable program code on a bench test computing device to generate a simulation output; and
comparing the simulation output to the at least one specification of the high level requirement to generate a pass or a fail result;
based upon the fail result, revising the computer-readable program code to automatically revise the model code unit, bench test computer-readable program code, and the procedure document.

2. The method of claim 1, wherein the at least one specification comprises a verification statement.

3. The method of claim 2, wherein the procedure document is based partly on the at least one high level requirement and specification.

4. The method of claim 2, wherein the step of executing the model code unit is further configured for analyzing whether signal time histories comply with the at least one specification of the high level requirement.

5. The method of claim 2, further comprising:
constructing an alias database comprising at least one alias name and corresponding alias information, and
the step of executing the model computer-readable program code further comprises:
receiving an alias name;
extracting the corresponding alias information from the alias database; and
inserting the corresponding alias information into the model code unit, the bench test computer-readable program code, and the procedure document.

6. The method of claim 5, wherein the corresponding alias information is selected from the group consisting of: a signal type, signal information, an alias description, a signal unit, a signal initial value, a signal description, and an alias source filename.

7. The method of claim 2, wherein the simulated output is bench test data.

8. The method of claim 2, further comprising a second simulation method comprising:
generating a simulated input time history for an aircraft fly-by-wire simulation using the model code unit;
receiving the simulated input time history into the aircraft fly-by-wire simulation on a computing device;
generating simulated output time histories from the aircraft fly-by-wire simulation; and
extracting simulated results from the simulated output time histories.

9. The method of claim 2, wherein the procedure document provides detailed instructions for demonstrating compliance with the at least one specification of the high level requirement.

10. A computer implemented system for generating a simulation model to evaluate aircraft flight systems prior to actual flight involving pilots and crew, comprising at least one processor configured to:
receive at least one specification for a high level requirement for a flight control law for the aircraft flight system;
receive an alias name and extract corresponding alias information; and
generate a model code unit for the flight control law of the aircraft flight system, based on a model computer-readable program code generated using the least one specification of the high level requirement; the model code unit is executed to generate a procedure document based on at least the high level requirement; and
execute the model code unit to perform a simulation method to generate a bench test computer-readable program code, the bench test computer-readable program code is similar to the procedure document, wherein a simulation output is generated based on execution of the generated bench test computer-readable program code;

review the procedure document to identify an error therein, wherein a comparison of the simulation output to the at least one specification of the high level requirement to generate a pass or a fail result;

based upon the identified error or the pass or fail, revising the computer-readable program code to automatically revise the model code unit, the bench test computer-readable program, and the procedure document.

11. The system of claim 10, wherein the corresponding alias information is selected from the group consisting of: a signal type, signal information, an alias description, a signal unit, a signal initial value, a signal description, and an alias source filename.

12. The system of claim 10, wherein the model code unit is configured to automatically generate a bench test computer-readable program code.

13. The system of claim 10, wherein the model code unit is configured to generate a simulated input time history when at least one input command is provided to an aircraft fly-by-wire simulation and to receive expected results extracted from simulation output time histories.

14. The system of claim 10, wherein the procedure document provides detailed instructions for demonstrating compliance with the at least one specification for a high level requirement for an aircraft flight system.

* * * * *